United States Patent
Futamata et al.

(10) Patent No.: US 9,648,743 B2
(45) Date of Patent: May 9, 2017

(54) MULTILAYER GLASS CERAMIC SUBSTRATE WITH EMBEDDED RESISTOR

(71) Applicant: EPCOS AG, Munich (DE)

(72) Inventors: Yousuke Futamata, Tokyo (JP); Hisashi Kobuke, Tokyo (JP)

(73) Assignee: SNAPTRACK, INC., San Diego, CA (US)

( * ) Notice: Subject to any disclaimer, the term of this patent is extended or adjusted under 35 U.S.C. 154(b) by 0 days.

(21) Appl. No.: 14/365,965

(22) PCT Filed: Nov. 29, 2012

(86) PCT No.: PCT/JP2012/080810
§ 371 (c)(1),
(2) Date: Jun. 16, 2014

(87) PCT Pub. No.: WO2013/088957
PCT Pub. Date: Jun. 20, 2013

(65) Prior Publication Data
US 2014/0305685 A1    Oct. 16, 2014

(30) Foreign Application Priority Data
Dec. 16, 2011    (JP) ................. 2011-276172

(51) Int. Cl.
| H05K 1/09 | (2006.01) |
| H05K 1/16 | (2006.01) |
| H05K 1/03 | (2006.01) |
| H05K 3/46 | (2006.01) |

(52) U.S. Cl.
CPC .......... *H05K 1/167* (2013.01); *H05K 1/0306* (2013.01); *H05K 3/4629* (2013.01)

(58) Field of Classification Search
None
See application file for complete search history.

(56) References Cited

U.S. PATENT DOCUMENTS

| | | | | |
|---|---|---|---|---|
| 3,266,005 A | * | 8/1966 | Balde | H01C 7/00 219/543 |
| 3,652,207 A | | 3/1972 | Wuhrer et al. | |
| 4,424,251 A | * | 1/1984 | Sugishita | C03C 10/00 174/258 |
| 4,490,429 A | | 12/1984 | Tosaki et al. | |
| 4,738,871 A | * | 4/1988 | Watanabe | B41J 2/33515 338/308 |
| 5,144,279 A | * | 9/1992 | Yajima | H01C 7/021 338/270 |

(Continued)

FOREIGN PATENT DOCUMENTS

| DE | 3227657 A1 | 2/1983 |
| JP | S5147680 B1 | 12/1976 |

(Continued)

*Primary Examiner* — Steven T Sawyer (57) ABSTRACT

A multilayer glass ceramic substrate includes a number of insulating layers composed of glass ceramics. An embedded resistor is formed between the insulating layers. The resistor includes scattered microvoids and includes materials containing conductive powders and glass powders. First and second internal conductors are provided where a first end of the embedded resistor is connected to the first internal conductor and a second end of the embedded resistor is connected to the second internal conductor.

4 Claims, 5 Drawing Sheets

(56) References Cited

U.S. PATENT DOCUMENTS

| | | | |
|---|---|---|---|
| 2002/0189859 A1* | 12/2002 | Shiraishi | H01L 21/4857 174/261 |
| 2003/0001719 A1* | 1/2003 | Schemenaur et al. | 338/308 |
| 2003/0113554 A1 | 6/2003 | Umayahara et al. | |
| 2004/0144476 A1* | 7/2004 | Fukuta et al. | 156/89.11 |
| 2004/0239476 A1* | 12/2004 | Krumphals | H01C 7/18 338/48 |
| 2010/0151217 A1* | 6/2010 | Kanada et al. | 428/217 |
| 2010/0210453 A1* | 8/2010 | Hu | B22F 7/002 502/184 |

FOREIGN PATENT DOCUMENTS

| | | |
|---|---|---|
| JP | S62252901 A | 11/1987 |
| JP | H0232865 A | 2/1990 |
| JP | H0343786 A1 | 2/1991 |
| JP | 719963 B2 | 3/1995 |
| JP | H08162762 A1 | 6/1996 |
| JP | 2002032865 A | 1/2002 |
| JP | 2003055034 A | 2/2003 |
| JP | 2006100445 A | 4/2006 |
| JP | 2006108530 A | 4/2006 |
| JP | 2006237493 A | 9/2006 |

\* cited by examiner

Table 1

| | Void Ratio (%) | Average Void Size (μm) | Resistivity 3σ/ave(%) | Glass for Resistor Softening Point Tri (°C) | Glass for Resistor Composition | Glass for Insulating Layer Softening Point Tri (°C) | Glass for Insulating Layer Composition |
|---|---|---|---|---|---|---|---|
| Ex. 1 | 3.5 | 0.92 | 5.7 | 771 | SiO₂-B₂O₃-Al₂O₃-RO based | 780 | SiO₂-CaO-MgO based |
| Ex. 2 | 7.1 | 2.96 | 6 | 675 | SiO₂-B₂O₃-RO-R₂O based | 780 | SiO₂-CaO-MgO based |
| Ex. 3 | 8.2 | 2.11 | 6.8 | 778 | SiO₂-B₂O₃-RO based | 780 | SiO₂-CaO-MgO based |
| Ex. 4 | 8.7 | 1.89 | 7.1 | 738 | SiO₂-B₂O₃-ZrO₂-R₂O based | 780 | SiO₂-CaO-MgO based |
| Ex. 5 | 10.7 | 1.8 | 7.3 | 825 | SiO₂-B₂O₃-R₂O based | 780 | SiO₂-CaO-MgO based |
| Ex. 6 | 16.2 | 2.84 | 10.4 | 850 | SiO₂-RO-R₂O based | 780 | SiO₂-CaO-MgO based |
| Ex. 7 | 3.9 | 1.07 | 8.1 | 771 | SiO₂-B₂O₃-Al₂O₃-R₂O based | 800 | SiO₂-B₂O₃-Al₂O₃-RO based |
| Ex. 8 | 3.8 | 1.03 | 8.2 | 771 | SiO₂-B₂O₃-Al₂O₃-RO based | 771 | SiO₂-CaO-MgO based |
| Comp. Ex. 1 | 33.2 | 13.2 | 38 | 600 | SiO₂-B₂O₃-RO-R₂O based | 780 | SiO₂-CaO-MgO based |
| Comp. Ex. 2 | 32 | 7.5 | 22 | 650 | Bi₂O₃-SiO₂-B₂O₃ based | 780 | SiO₂-CaO-MgO based |
| Comp. Ex. 3 | 22.1 | 3.2 | 15.6 | 865 | SiO₂-RO-R₂O based | 780 | SiO₂-CaO-MgO based |
| Comp. Ex. 4 | 21 | 7.3 | 26.3 | 680 | Bi₂O₃-SiO₂-B₂O₃ based | 771 | SiO₂-B₂O₃-Al₂O₃-R₂O based |

FIG. 8

Table 2

| | Void Ratio (%) | Resistivity 3σ/ave(%) | Glass Softening Point (°C) | Glass for Resistor Composition | Glass Particle Size Distribution D50(μm) | Glass for Insulating Layer Composition |
|---|---|---|---|---|---|---|
| Ref. Ex. 1 | 13.4 | 10.5 | 771 | SiO₂-B₂O₃-Al₂O₃-RO based | 1.72 | SiO₂-CaO-MgO based |
| Ex. 1 | 3.5 | 5.7 | 771 | SiO₂-B₂O₃-Al₂O₃-RO based | 1.65 | SiO₂-CaO-MgO based |

MULTILAYER GLASS CERAMIC SUBSTRATE WITH EMBEDDED RESISTOR

This patent application is a national phase filing under section 371 of PCT/JP2012/080810, filed Nov. 29, 2012, which claims the priority of Japanese patent application 2011-276172, filed Dec. 16, 2011, each of which is incorporated herein by reference in its entirety.

TECHNICAL FIELD

The present invention relates to a resistor-incorporated multilayer glass ceramic substrate, which is manufactured by incorporating a resistor into a multilayer glass ceramic substrate.

BACKGROUND

Recently, as mobile communication devices such as a smart phone are increasingly sophisticated with multi-functionality, it is required that passive elements including a substrate are densified, further sophisticated, and miniaturized as well as active elements such as a semiconductor element are highly integrated and densified. The multilayer glass ceramic substrate is used in bare chip mounting multi-chip module, mobile communication module, and on-vehicle ECU substrate. However, by incorporating passive elements such as a capacitor, an inductor, and a resistor in the inside, it enables to reduce a mounting area and thereby it enables to advance miniaturization and high functionalization.

For example, when a resistor element is formed on the substrate, desired resistance value can be adjusted by measuring an initial resistance value and then performing a laser trimming and the like, after resistor pastes are printed and then fired. However, when the resistor element is formed inside the multilayer glass ceramic substrate, a laser trimming and the like cannot be performed and it is unable to adjust the resistance value of resistor. Therefore, it becomes important to control fluctuation of resistance value in the processes of printing and firing and the like.

Further, for the method of forming a resistor inside the multilayer glass ceramic substrate, the following methods are known, for example. By respectively adding solvent, organic binder, dispersing agent, plasticizer and the like to ceramic powders and then blending, ceramic slurry is produced. The ceramic slurry is applied on a support body such as a PET film and the like to form a ceramic sheet called a green sheet. On this green sheet, conductor pastes such as silver and resistor pastes are printed. By laminating a plurality of the above sheets and firing after performing thermocompression, it enables to obtain a multilayer glass ceramic substrate wherein a resistor is incorporated.

For example, in Japanese Published Application No. 2006-108530, the resistor paste is made by blending conductive powders and glass powders. By using the resistor paste that a transition temperature Tg of glass component included in the aforementioned glass powders and a firing temperature Tc of ceramics satisfy the relation "Tc−150≤Tg≤Tc", it enables to inhibit a dispersion of the glass component in the resistor into the glass ceramic and thereby enables to obtain a resistor-incorporated multilayer glass ceramic substrate that the fluctuation of resistance values among products is improved.

Further, the resistor is subject to stress in a shrinkage direction from the outside to the inside, which is caused by shrinkage due to a sintering of ceramics. Therefore, even if the glass does not reach a softening point, it enables to transform the glass from a powdered state into a sintered state by receiving the stress from ceramics if a glass transition occurs. In view of the above, the range is specified by the firing temperature Tc and the transition temperature Tg of glass component of resistor paste.

SUMMARY OF THE INVENTION

In embodiments of the invention, a multilayer glass ceramic substrate comprises an embedded resistor and a plurality of insulating layers composed of glass ceramics. At least a pair of internal conductors is provided for connecting the resistor formed between the insulating layers. Both ends of the resistor are respectively connected to the pair of internal conductors. The resistor includes scattered microvoids and is comprised of materials containing conductive powders and glass powders.

In various embodiments, a softening point of glass powders used for the resistor is expressed by Tr1. A softening point of glass powders used for the insulating layers is expressed by Tc1. The relation of "Tc1−110≤Tr1≤Tc1+70" is satisfied.

In various embodiments, the insulating layer includes a crystallized glass having a diopside crystal, that contains $SiO_2$, CaO, and MgO, as a main phase.

In various embodiments, the proportion of the microvoids in the resistor on the cross section of the resistor that is parallel to a laminating surface of the multilayer glass ceramic substrate is 20% or less.

DETAILED DESCRIPTION OF ILLUSTRATIVE EMBODIMENTS

The following will first describe a problem to be solved by the invention along with a solution to the problem. Embodiments for carrying out the invention will then be described with respect to the drawings.

Japanese Published Unexamined Application No. 2006-108530 indicates that it enables to transform the glass from a powdered state into a sintered state by receiving the stress from ceramics if a glass transition occurs, even if the glass does not reach a softening point. However, when the glass having a glass transition point which is near a firing temperature of ceramics is used, the fluidity of glass is poor and it is difficult to sufficiently wet the conductive materials of resistor with glass components. Therefore, although the glass can be transformed into a sintered state, there is a possibility that a lot of pores (voids) are formed in the inside and thereby a dense resistor cannot be obtained. With this, the density of the conductive materials inside the resistor tends to be locally fluctuated and it becomes difficult to reduce fluctuations of resistance values.

It is therefore an object of the present invention to provide a multilayer glass ceramic substrate with an embedded resistor capable of solving the above-mentioned problems. Specifically, it is an object of the present invention to provide a multilayer glass ceramic substrate with an embedded resistor having less fluctuation of resistance values.

In order to solve the above-mentioned problems of the conventional arts, there is provided a multilayer glass ceramic substrate comprising an embedded resistor, a plurality of insulating layers composed of glass ceramics, at least a pair of internal conductors for connecting the resistor formed between the insulating layers, wherein both ends of the resistor are respectively connected to the pair of internal conductors, wherein the resistor is comprised of materials containing conductive powders and glass powders, and further it has scattered microvoids. The embedded resistor may also be incorporated into the multilayer glass ceramic substrate.

In the present specification, note that the size of "microvoid" indicates as follows. For the spherical-shaped void having an aspect ratio of 1.0 to 1.5, it indicates a median size (D50). Further, for the other shaped void, it indicates an arithmetic mean value of long diameter and short diameter. They are the average value of randomly selected 50 voids. When this value is 3 μm or less, such void is determined as "microvoid".

When the shape of void gets larger, it causes widened fluctuations in length of the conductive path formed of conductive powders inside of the resistor depending on the presence or absence of voids, and that results in an increase in fluctuations of resistance values.

Further, for the present invention, a softening point of glass powders used for resistor is expressed by Tr1 and a softening point of glass powders used for insulating layers composed of glass ceramics is expressed by Tc1, and the relation of "Tc1−110≤Tr1≤Tc1+70" is satisfied. The range of Tc1 and Tr1 is respectively 730° C.≤Tc1≤830° C. and 620° C.≤Tr1≤900° C., more preferably 750° C.≤Tc1≤800° C. and 650° C.≤Tr1≤870° C.

When the relation appears as follows "Tc1−110>Tr1", fluid viscosity of glass for the resistor at a firing temperature decreases and thereby a lot of voids are formed inside of the resistor by foaming of the glass. With this, fluctuations of resistance values increase. Further, when the relation appears as follows "Tr1>Tc1+70", fluid viscosity of glass for the resistor at a firing temperature is high and portions where the conductive powders cannot be covered by the glass are formed as voids. With this, fluctuations of resistance values increase.

In view of this, it is preferable that the above relation is satisfied.

As a glass powder used for the resistor, it is not particularly limited as long as it satisfies the above relation. However, for example, glass powders containing $SiO_2$, $B_2O_3$, and alkali metal oxide, glass powders containing $SiO_2$, $B_2O_3$, $Al_2O_3$ and alkali earth metal oxide, glass powders containing $SiO_2$, $B_2O_3$, and alkali earth metal oxide, glass powders containing $SiO_2$, $B_2O_3$, $ZrO_2$, and alkali metal oxide, and glass powders containing $SiO_2$, alkali metal oxide, and alkali earth metal oxide are preferable.

As a glass powder used for insulating layers composed of the glass ceramics, for example, glass powders composed of at least one kind of amorphous glass-based material (1) and crystallized glass-based material (2) is exemplified. For the crystallized glass-based material (2), it is the material in which multiple microscopic crystals are deposited in the glass components when heating and firing.

For the glass powder used for the insulating layers composed of the glass ceramics, it is preferably formed by using crystallized glass-based materials. As a crystallized glass-based material, for example, diopside crystal glass containing $SiO_2$, CaO and MgO can be used.

In the diopside crystal glass, $SiO_2$ serves as a network former and it is also a constituent of the diopside crystal. The content of $SiO_2$ is preferably 40 to 65 mass %, and more preferably 45 to 65 mass %, with respect to the total content of the diopside crystal glass. When the content of $SiO_2$ is less than 40 mass %, vitrification tends to be difficult. On the other hand, the content of $SiO_2$ exceeds 65 mass %, density tends to decrease.

In the diopside crystal glass, CaO is a constituent of the diopside crystal. The content of CaO is preferably 20 to 35 mass %, and more preferably 25 to 30 mass % with respect to the total content of the diopside crystal glass. When the content of CaO is less than 20 mass %, dielectric loss tends to increase. On the other hand, when the content of CaO exceeds 35 mass %, vitrification tends to be difficult.

In the diopside crystal glass, MgO is a constituent of the diopside crystal. The content of MgO is preferably 11 to 30 mass %, and more preferably 12 to 25 mass % with respect to the total content of the diopside crystal glass. When the content of MgO is less than 11 mass %, crystal is not likely to be deposited. On the other hand, when the content of MgO exceeds 30 mass %, vitrification tends to be difficult.

In the diopside crystal glass, $Al_2O_3$ is a constituent adjusting crystallinity of glass. The content of $Al_2O_3$ is preferably 0.5 to 10 mass %, and more preferably 1 to 5 mass % with respect to the total content of the diopside crystal glass. When the content of $Al_2O_3$ is less than 0.5 mass %, crystallinity tends to largely increase and it is likely to be difficult to form glass. On the other hand, when the content of $Al_2O_3$ exceeds 10 mass %, diopside crystal is not likely to be deposited.

In the diopside crystal glass, if Ag is used as a conductive material forming internal conductor, CuO may be added. CuO is a constituent giving electrons to Ag in order to prevent a diffusion into glass ceramics. The content of CuO is preferably 0.01 to 1.0 mass % with respect to the total content of the diopside crystal glass components. When the content of CuO is less than 0.01 mass %, the above effect is not likely to be fully achieved. On the other hand, when the content of CuO exceeds 1.0 mass %, dielectric loss tends to largely increase.

In the diopside crystal glass component, SrO, ZnO, and $TiO_2$ may be added in order for facilitating vitrification. The content of the above each constituent is preferably 0 to 10 mass %, and more preferably 0 to 5 mass % with respect to the total content of the diopside crystal glass component. When the content of each constituent is 10 mass % or more, crystallinity decreases. With this, the deposition amount of the diopside decreases and that results in an increase of dielectric loss.

Further, as diopside crystal glass components, other constituents except for the above may be contained as far as they do not deteriorate the properties, such as dielectric loss and the like.

For microvoids scattered in the resistor of the present invention, the proportion of the microvoids on the cross section in a horizontal direction of the resistor positioned in the multilayer glass ceramic substrate is 20% or less.

For the measurement of the microvoids, an observation is performed on appropriate 10 places of the cross section that appears by polishing the resistor in a horizontal direction. The average proportion of the measured microvoids is preferably 20% or less. Specifically, the cross section of the resister formed of substrate-incorporated resistor elements is formed by polishing, and area of voids and area of resistor are read with 2000 times magnification of compositional image by an image recognition software. After that, the area of microvoids existing on the polished surface is divided by the area of resistor and then multiplied by 100(%) to obtain the average of the measured values of appropriate 10 places.

According to the present invention, by obtaining the multilayer glass ceramic substrate with the embedded resistor having less fluctuation of resistance values as mentioned above, it enables to enhance yield stability.

The following is explanations of favorable embodiments of the present invention based on figures.

Figure 1:
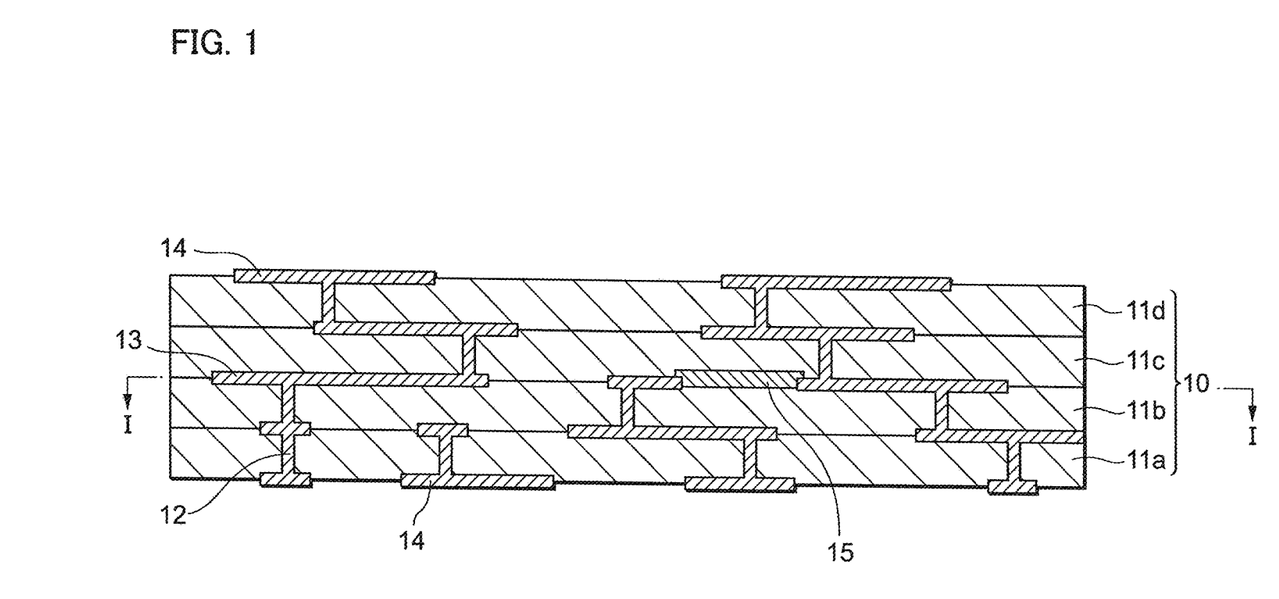
FIG. 1 shows a schematic cross section of the interconnection substrate of the present embodiment.

FIG. 1 shows a schematic cross section of the multilayer glass ceramic substrate with an embedded resistor of embodiments according to the present invention. The multilayer glass ceramic substrate 10 shown in FIG. 1 has a lamination structure wherein glass ceramics substrates 11a, 11b, 11c and 11d are laminated in this order (hereinafter referred to as glass ceramics substrates 11a to 11d). Further, the multilayer glass ceramic substrate 10 comprises an internal conductor 13 and an embedded resistor 15 provided between vertically adjacent glass ceramics substrates in FIG. 1, a surface conductor 14 provided on the surface of the glass ceramics substrate 11a (11d) which is the outermost layer, and a via conductor 12 electrically conductively connecting the internal conductor 13 and the surface conductor 14.

The following is explanations about each constituent and compositions of the same.

<Glass Ceramic Material>

As a glass material included in the glass ceramic substrates 11a to 11d, for example, a crystallized glass-based material is exemplified. For the crystallized glass-based material, it is the material wherein a lot of microcrystals are deposited in the glass component when heating and firing.

Generally, when amorphous glass-based material is used, the proportion of conductive powders and glass component in the embedded resistor fluctuates due to a mutual diffusion of the amorphous glass-based material and the glass component in the embedded resistor, and that results in an increase in fluctuation of resistance value. However, by using this crystallized glass-based material, the mutual diffusion of crystals deposited in the glass and glass components of the embedded resistor can be inhibited. Therefore, the effects of inhibiting fluctuations of resistance value caused by the above phenomenon can be expected.

As the crystallized glass-based material, for example, diopside crystal glass containing $SiO_2$, CaO, and MgO can be used. For the diopside crystal glass, the diopside crystal is deposited as a main crystal by firing.

As a ceramic material used as an aggregate, alumina, cordierite, mullite, spinel, quartz, amorphous silica and the like are used from the aspect of low dielectric constant and low loss.

<Resistor Material>

For a resistor paste, it is prepared by combining conductive powders and glass powders and then mixing with organic vehicle.

The conductive powders used for the resistor paste is not particularly limited. However, it is preferable to use the one that does not substantially include leads. For example, composite oxides such as $RuO_2$ and Ru may be used.

The organic vehicle used for the resistor paste is not particularly limited. However, as a binder resin, for example, ethyl cellulose, polyvinyl butylal, methacrylic resin, butylmethacrylate and the like may be used. Further, as a solvent, for example, terpineol, butyl carbitol, butyl carbitol acetate, toluene, alcohols, xylene and the like may be used. The organic vehicle can be prepared by heating and stifling the solvent to dissolve the binder resin.

Further, as glass powders used for the resistor paste, a glass having a glass softening point $Tr_1$ (° C.) is used so that a glass softening point $Tc_1$ (° C.) of glass powders of the insulating layers satisfies the relation "$Tc_1-110 \leq Tr_1 \leq Tc_1+70$". When the glass for resistor having the relation of "$Tc_1-110 > Tr_1$" is used, foaming of glass generates at a firing temperature, and thereby it causes huge voids and also large voids formed by successive pores inside of the resistor. Further, when the glass for resistor having the relation of "$Tc_1+70 \leq Tr_1$" is used, it is likely to cause a lot of voids inside of the resistor since the sintered state is insufficient. With this, favorable dispersibility of the conductive powders cannot be obtained and that results in fluctuations of resistance values. For the ranges of Tc1 and Tr1, they are respectively preferably 730° C.$\leq Tc1 \leq$830° C. and 620° C.$\leq Tr1 \leq$900° C., more preferably, 750° C.$\leq Tc1 \leq$800° C. and 650° C.$\leq Tr1 \leq$870° C.

In the present invention, as a cause of the fluctuation of resistance value, it is considered that the state of voids generated inside of the resister affects the fluctuation of resistance value. Therefore, in order to control the state of voids inside of the resistor, a softening point of glass is focused.

For the "softening point of glass" of the present invention, it denotes a temperature that the glass softens and deforms under its own weight. Specifically, it is a deformation initiation temperature by a fiber elongation method, or a temperature at a skirt of a second absorbent portion on a curved line measured by a differential thermal analysis (DTA). Further, for the glass softening point (° C.) of the present specification, it is measured by a differential thermal analyzer (TG8120) manufactured by Rigaku.

Figure 2:
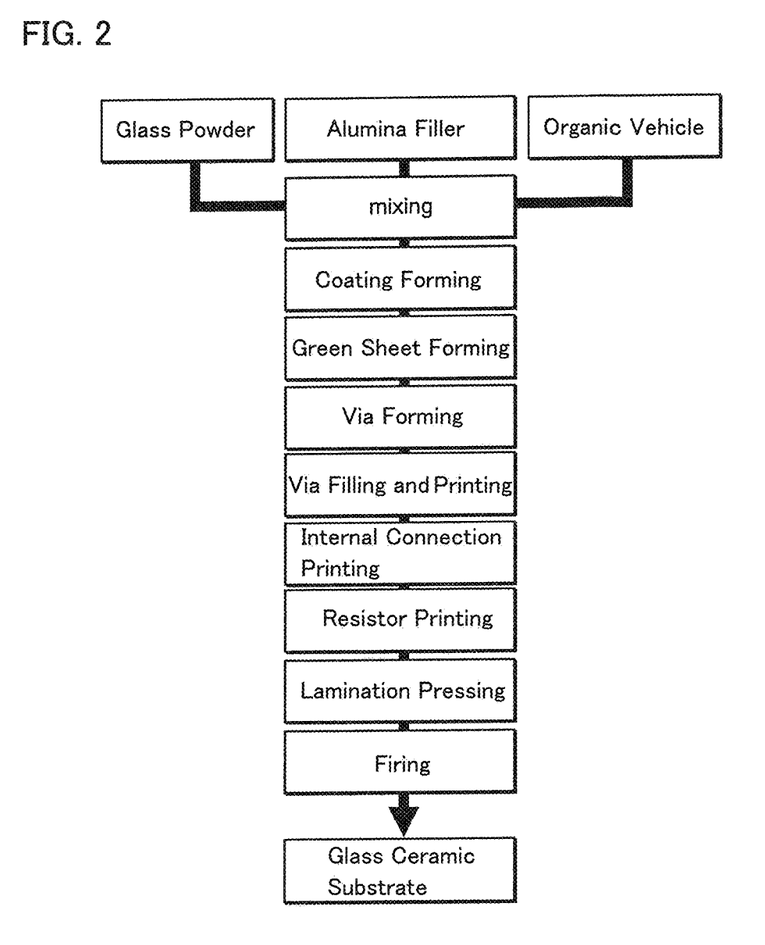
FIG. 2 shows a flow chart of manufacturing processes of the interconnection substrate of the present embodiment.

Next, the following is explanations about manufacturing processes of the multilayer glass ceramic substrate by using the above-mentioned resistor paste. FIG. 2 shows a flow chart of the above processes.

FIG. 2 shows a flow chart of manufacturing processes of the interconnection substrate of the present embodiment.

<Glass Ceramics>

Glass powder, ceramic filler and organic vehicle containing binder, solvent, plasticizing agent, dispersing agent and the like are mixed to prepare slurry coatings. For the mixing, a general coating material producing device such as a ball mill can be used. The additive amount of each additive is determined according to the sheet thickness formed in a subsequent process and types of film forming devices and the like.

As a binder, for example, polyvinyl butyral resin, methacrylic acid resin and the like are exemplified. As a plasticizing agent, for example, dibutyl phthalate and the like are exemplified. As a solvent, for example, toluene, methyl ethyl ketone and the like are exemplified.

The prepared coatings are applied on the support body such as a polyethylene-telephthalate (PET) sheet to form a film. With this, it enables to form a green sheet for glass ceramic substrate on the support body. For a film forming method, doctor blade method, calendar roll method and the like can be used.

Next, via holes for internal conductor connection via are formed on the green sheet by a mechanical punching or $CO_2$ laser and the like. Next, the via holes are filled and printed with the conductor paste. Next, the internal conductor electrode pattern for connecting the resistor is print-formed with the conductor paste and then dried. After that, the resistor paste is print-formed at a predetermined position.

For the conductor paste used for forming the conductor pattern, it can be prepared by mixing conductive materials composed of various metals such as Ag, Ag—Pd alloy, Cu, and Ni or composed of alloys with the organic vehicle. The organic vehicle used for the conductor paste contains binder and solvent as main components. The mix proportion of binder, solvent and conductive material are not particularly limited, and for example, 1 to 15 mass % of binders and 10 to 50 mass % of solvents may be combined with respect to the conductive materials. For the conductor paste, additives selected from various dispersing agents and plasticizing agents may be added as necessary.

Further, when the resistor is print-formed by the above resistor paste, the resistor paste is printed so that it overlaps with the above-mentioned internal conductor electrode pattern after drying respectively about 100 μm at both ends in a longitudinal direction by using a printing pattern of "1.0 mm×1.2 mm". As above, a plurality of green sheets for the glass ceramic substrate on which the internal conductor and the resister are printed are laminated and pressed. After that, firing is performed to obtain a multilayer glass ceramic substrate with an embedded resistor.

In a firing process for manufacturing this multilayer glass ceramic substrate, a shrinkage-free firing process may be used. In this process, a laminated body comprising green sheets and another green sheets, positioned sandwiching a laminated body of the green sheets, exhibiting lower thermal shrinkage than the green sheet, or another green sheets which are not sintered at a firing temperature of the green sheet is fired. By performing this shrinkage-free firing process, shrinkage, when firing, in a direction of the surface of the green sheet which serves as a glass ceramic substrate is inhibited and thereby the effect of inhibiting shrinkage fluctuations in a direction of embedded resistor surface can be expected.

For the resistor embedded in the multilayer glass ceramic substrate which is obtained as above, it has a structure that scattered microvoids are provided inside. Conventionally, when voids having a larger form exist inside the resistor, conductive paths are formed inside the resistor avoiding the void part. Therefore, fluctuations of the length of the conductive path increase with respect to each resistor and that results in an increase in fluctuations of resistance values. In the present invention, by making voids inside of the resistor as scattered microvoids, it enables to obtain a stable length of conductive path, and also enables to obtain a multilayer glass ceramic substrate with an embedded resistor exhibiting less fluctuations of resistance values of the embedded resistor.

An example will now be described.

<Manufacturing of Resistor Paste>

2 grams of ruthenium oxide as a conductive material and 3.5 grams of glass powders B were dispersed in vehicle composed of ethyl cellulose and butyl carbitol by using a triple roll mill to manufacture resistor paste. Further, the ratio of the total mass of conductive materials and glass powders B vs. the mass of the organic vehicle was determined in the range of 1:0.5 to 1:4 to manufacture resistor paste, so that the obtained resistor paste has a viscosity suitable for a screen printing.

<Manufacturing of Dielectric Paste for Glass Ceramic Substrate>

First, glass powders A (crystallized glass powder, containing $SiO_2$, CaO, and MgO as main components, capable of depositing diopside) and alumina fillers were prepared. 19.4 g of acrylic resin, 59.1 grams of toluene, 3 grams of ethanol, 6.5 grams of plasticizing agent (butyl phtalyl butyl glycolate) were mixed to prepare the organic vehicle. Further, glass powders A, alumina filler and the prepared organic vehicle were combined and mixed for 24 hours by using a ball mill to prepare the dielectric paste.

<Manufacturing of Multilayer Glass Ceramic Substrate>

The prepared dielectric paste was applied on the polyethylene-telephthalate (PET) film by a doctor blade method to form a film, and then to form a plurality of green sheets of the glass ceramic substrate. Next, via holes for the vias connecting internal conductors were formed on the green sheet by a CO2 laser. Next, the via holes were filled and printed with silver paste. Next, an internal conductor electrode pattern for connecting the resistor was print-formed by the silver paste and then dried. After that, it was further print-formed by the resistor paste at a predetermined position. The resistor paste was printed so that it overlapped with the internal conductor electrode pattern for connecting the resistor, respectively about 100 μm at both ends in a longitudinal direction by using a printing pattern of "1.0 mm×1.2 mm". A plurality of green sheets for glass ceramic substrate on which the internal conductor electrode pattern and the resistor paste were printed were laminated to obtain a laminated body, and unsintered green sheets were positioned sandwiching the laminated body. After pressing was performed at 25 MPa, firing was performed at 900° C. for two hours to obtain a multilayer glass ceramic substrate for evaluation of resistor value of the embedded resistor.

For the evaluation of resistance value of the resistor, the resistance value of the embedded resistor was measured by a digital multimeter CDM-2000D manufactured by CUSTOM. The resistivity fluctuations of the embedded resistor were calculated from the measured values of 30 samples.

The resistivity fluctuations shown in Table 1 can be calculated by the formula "($3\sigma$/average of resistance values)×100(%)". The following is more detailed explanations of this calculation method.

For the method of calculating the resistivity, a resistance value of resistor is expressed by RDC, a cross-section area of resistor is expressed by S, and a length of resistor (a distance between a pair of internal conductor for connecting resistor) is expressed by L, and the resistivity can be expressed by the following formula (1).

$$\text{Resistivity } (\Omega\cdot mm) = RDC \times S/L \qquad (1)$$

Figure 3:
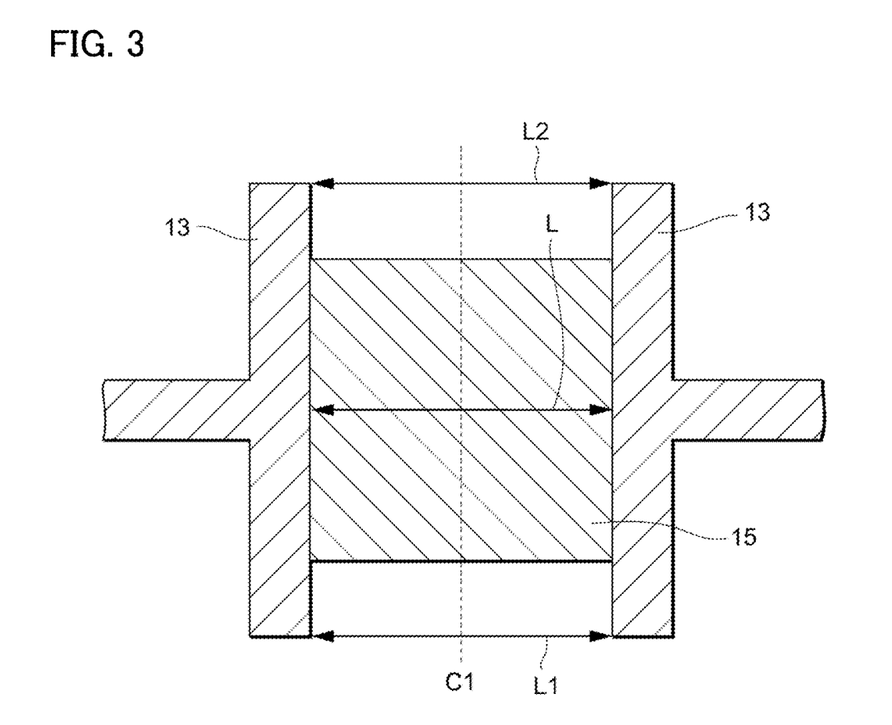
FIG. 3 shows a schematic cross section of the portion of resistor inside the interconnection substrate of the present embodiment (a schematic cross section taken along line I-I of FIG. 1)

For the length L (a distance between a pair of internal conductor for connecting resistor) of resistor, the average value of distance between both end parts of the pair of internal conductor for connecting resistor is expressed by L, and this value can be obtained by the formula "L=(L1+L2)/2". FIG. 3 shows a schematic cross section of the embedded resistor 15, taken along line I-I of FIG. 1.

C1 of FIG. 3 indicates a measurement location of the cross section which is in a direction vertical to a lamination plane of the multilayer glass ceramic substrate. Further, the cross section area of the embedded resistor 15 formed by cutting, parallel to the pair of internal electrodes, near the center of the pair of internal electrodes for connecting resistor was read by an image recognition software, and the cross section area is expressed by S. With the above obtained resistivity (1), the resistivity fluctuations can be calculated by the formula "(3σ/average of resistivity)×100(%)".

By evaluating the resistivity fluctuations, it enables to inhibit fluctuations of thickness of print films and also enables to remove factors for fluctuations of resistance value except for the resistor. In view of the above, the resistivity fluctuation, which is volume resistivity, was evaluated in order to clearly show a reduction effect of fluctuations of resistance values of the present invention due to a reduction of voids inside of the resistor.

Figure 7:
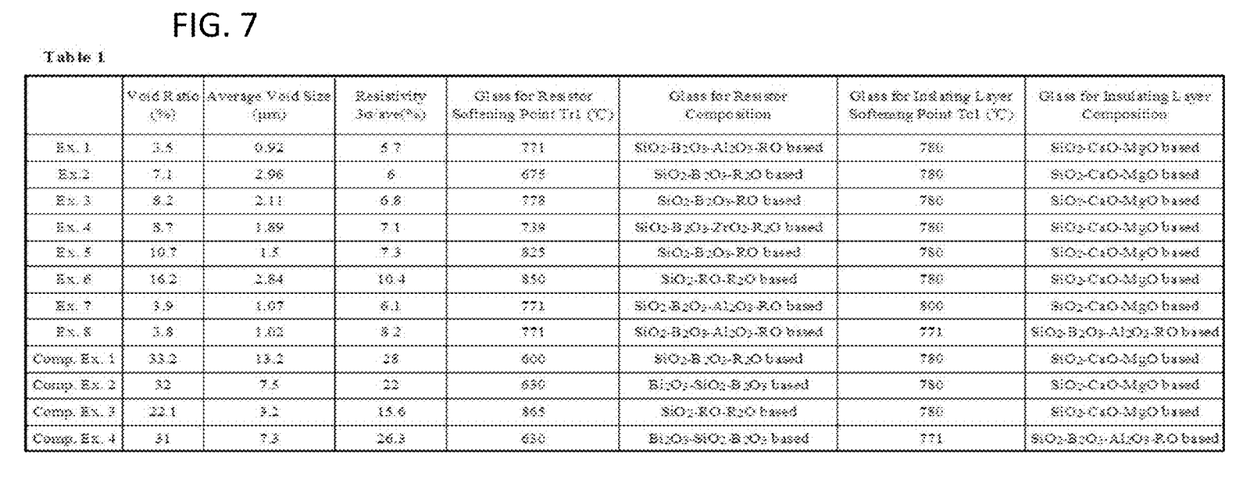
FIG. 7 is a table (Table 1) showing results of examples and comparative examples.

The following is explanations about specific Examples and Comparative Examples based on the experimental results. The results of Examples and Comparative Examples are shown in Table 1, which is provided in FIG. 7.

Figure 4:
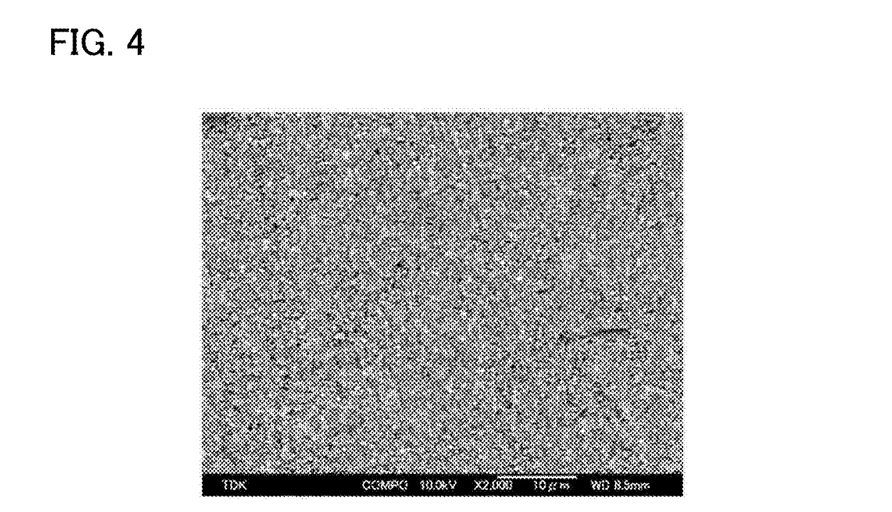
FIG. 4 is a microphotograph showing voids inside of the embedded resistor of Example 1.
Figure 5:
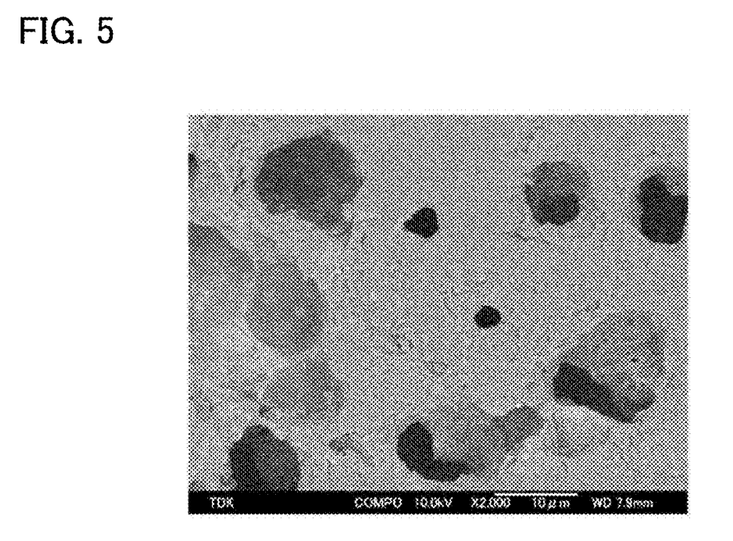
FIG. 5 is a microphotograph showing voids inside of the embedded resistor of Comparative Example 1.
Figure 6:
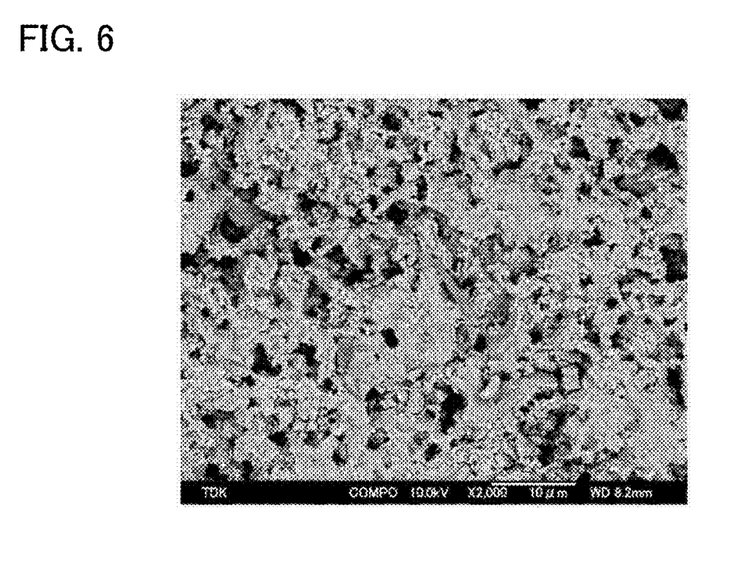
FIG. 6 is a microphotograph showing voids inside of the embedded resistor of Comparative Example 2.

FIG. 4 is an electromicroscopic photograph showing a condition of cross section which is parallel to a laminating surface of the embedded resistor of the multilayer glass ceramic substrate of Example 1, and FIGS. 5 and 6 are electromicroscopic photographs respectively showing a condition of cross sections which are parallel to the laminating surface of the embedded resistor of the multilayer glass ceramic substrate of Comparative Examples 1 and 2. In Example 1, $SiO_2$—$B_2O_3$—$Al_2O_3$—$R_2O$ based substance was used in the glass for resistor and a void ratio inside of the embedded resistor was 3.5%, and microvoids having a long diameter of approximately 1 μm to 2 μm were scattered. As a result, the resistivity fluctuation improved.

In Comparative Examples 1 and 2, $SiO_2$—$B_2O_3$—$R_2O$ based substance and $Bi_2O_3$—$SiO_2$—$B_2O_3$ based substance were respectively used in glasses for resistor, and the void ratio inside of the embedded resistor turned out to be high. In Comparative Example 1, huge voids were formed, like generated voids were unified as one entity during the firing process. From the image of cross section shown in FIG. 5, it was confirmed that large voids having a diameter of 20 μm existed in a longitudinal direction and the void ratio was 33.2%. Further, in Comparative Example 2, large voids were formed by communicating small voids continuously. From the image of cross section shown in FIG. 6, it was confirmed that voids having a diameter of 10 μm or more in a longitudinal direction were formed by communicating small voids having a diameter of 5 μm or less, and the void ratio was 32%.

In Comparative Examples 1 and 2, the relation between a glass softening point $Tr_1$ of the glass for resistor and a softening point $Tc_1$ of the glass for glass ceramic materials was expressed by "$Tc_1-110>Tr_1$". For this reason, it is considered that relatively large voids generated inside of the resistor since foaming generated in the glass for resistor due to impurities and a gasification of the glass component for resistor. Further, as a result of this, a lot of voids existed inside of the resistor and that resulted in an increase in resistivity fluctuations.

As for the glasses for resistor in Examples 2, 3, and 4, they all satisfy the relation "$Tc_1-110 \leq Tr_1$". The favorable result, that these resistivity fluctuations were all 10% or less, could be obtained. By inhibiting voids that the void ratio inside of the resistor was 10% or less, it enabled to improve the resistivity fluctuations.

As for the glasses for resistor in Examples 5 and 6, they all satisfied the relation "$Tr_1 \leq Tc_1+70$", and the void ratio inside of the resistor turned out to be 10% or more. This was because that voids generated inside of the resistor due to a decrease of fluidity of the glass at a firing temperature, thereby the dispersion state of $RuO_2$ which is conductive powders got worse, and that resulted in an increase in resistivity fluctuations compared with Examples 2, 3 and 4.

As for the glasses for resistor in Examples 7 and 8, they were the same with the glass for resistor of Example 1. As the glasses for insulating layers, $SiO_2$—CaO—MgO based glass having a softening point 800° C. and $SiO_2$—$B_2O_3$—$Al_2O_3$—$R_2O$ based glass having a softening point 771° C. were used and both glasses satisfied the relation "$Tc_1-110 \leq Tr_1$". A favorable result that the resistivity fluctuation was 10% or less was obtained. By inhibiting voids that the void ratio inside of the resistor is 10% or less, it enabled to improve the resistivity fluctuations.

The glass for resistor in Comparative Example 3 satisfied the relation "$Tr_1 > Tc_1+70$", and the void ratio inside of the resistor turned out to be 20% or more. This was because that voids generated inside of the resistor due to a decrease of fluidity of glass at a firing temperature, thereby the dispersion state of $RuO_2$ which is conductive powders got worse, and the results in an increase in resistivity fluctuations.

In Comparative Example 4, as a glass for insulating layer, $SiO_2$—$B_2O_3$—$Al_2O_3$—$R_2O$ based glass was used and further, as a glass for resistor, the same glass was used with Comparative Example 2. Both glasses satisfied the relation "$Tc_1-110>Tr_1$" as with Comparative Example 2 and the void ratio inside of the resistor turned out to be 20% or more. It is considered that this was because foaming generated in the glass for resistor due to impurities and a gasification of the glass component for resistor, and thereby relatively large voids generated inside of the resistor. As a result of this, a lot of voids existed inside of the resistor and thereby the resistivity fluctuations increased.

Figure 8:
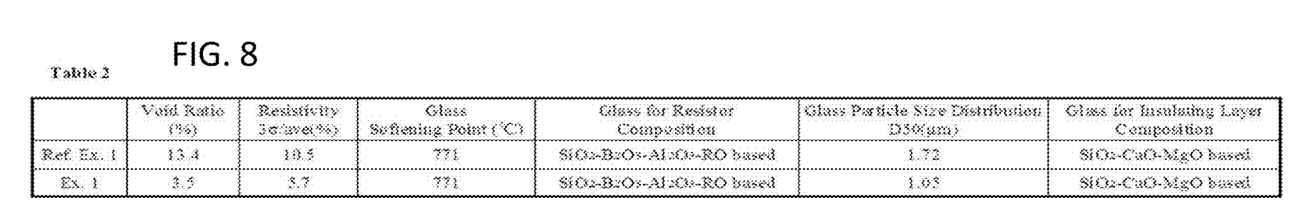
FIG. 8 is a table (Table 2) showing a reference example regarding particle size of glasses for resistor.

A reference example regarding particle size of glasses for resistor is indicated in Table 2, which is illustrated in FIG. 8.

By using glasses for resistor having the same composition, resistors using glasses that have different particle size distribution (D50) were compared. From this, it was confirmed that the void ratio of Reference Example 1, in which particle size distribution value was high, turned out to be 13.4% and the void ratio of Example 1, in which particle size distribution value was low, turned out to be 3.5%. It is considered that this was because a lot of voids were formed among glasses due to a decrease of filling ability of the glass which is caused by an increase of the average particle size of the glass particles, and that resulted in an increase of the void ratio. In view of this, it is preferable to make the glass particle size for resistor smaller. As for the range of the glass particle size distribution (D50), it is preferable that it satisfies the relation "0.5 μm ≤ D50 ≤ 1.5 μm. When the glass particle size distribution appears to be D50<0.5 μm, dry shrinkage of paste increases. Therefore, when the print dry film thickness increases, cracks may be caused on the resistor after printing and drying, and that might result in an increase of the resistivity fluctuations. Further, when the glass particle size distribution appears to be 1.5 μm<D50, the resistivity fluctuations tend to increase because of the above reasons. Therefore, these two cases are undesirable.

The glass particle size distribution D50 (average particle size) here indicates a volume average particle size measured by using commercially available laser diffraction type particle size distribution measuring apparatus.

The invention claimed is:

1. A multilayer glass ceramic substrate comprising:
   a plurality of insulating layers composed of glass ceramics;
   an embedded resistor formed between the insulating layers, wherein the resistor includes scattered microvoids and is comprised of materials containing conductive powders and glass powders, wherein an average size of the scattered microvoids is 3 μm or less, and wherein the average size of the scattered microvoids is 0.92 μm or more; and a first and a second internal conductor, wherein a first end of the embedded resistor is connected to the first internal conductor and a second end of the embedded resistor is connected to the second internal conductor;

wherein a softening point of glass powders used for the resistor is expressed by $Tr_1$;

wherein the softening point of glass powders used for the insulating layers is expressed by $Tc_1$;

wherein $Tc_{1-110} \leq Tr_1 \leq Tc_1 + 70$ in degrees Celsius; and wherein $750° C. \leq Tc_1 \leq 800° C.$ 2. The multilayer glass ceramic substrate according to claim 1, wherein the insulating layer comprises a crystallized glass having a diopside crystal, that contains $SiO_2$, CaO, and MgO, as a main phase.

3. The multilayer glass ceramic substrate according to claim 1, wherein the proportion of the microvoids in the resistor on a cross section of the resistor that is parallel to a laminating surface of the multilayer glass ceramic substrate is 20% or less.

4. The multilayer glass ceramic substrate according to claim 2, wherein the proportion of the microvoids in the resistor on a cross section of the resistor that is parallel to a laminating surface of the multilayer glass ceramic substrate is 20% or less.

* * * * *